United States Patent

Thompson

[15] 3,644,835

[45] Feb. 22, 1972

[54] PHASE DETECTOR AND DIGITAL PHASE-LOCKED LOOP

[72] Inventor: James E. Thompson, Scottsdale, Ariz.

[73] Assignee: Motorola, Inc., Franklin Park, Ill.

[22] Filed: Dec. 21, 1970

[21] Appl. No.: 99,764

[52] U.S. Cl...............................328/133, 328/109, 328/166, 307/232

[51] Int. Cl........................................................H03d 13/00

[58] Field of Search..................328/109, 133, 140, 166, 155; 307/232, 295, 214

[56] References Cited

UNITED STATES PATENTS 3,226,708 12/1965 Garden.................................307/214

FOREIGN PATENTS OR APPLICATIONS 1,019,002 11/1957 Germany...............................328/133

*Primary Examiner*—Donald D. Forrer
*Assistant Examiner*—R. E. Hart
*Attorney*—Mueller & Aichele

[57] ABSTRACT

There is disclosed a phase detector which operates in a current mode to detect the phase difference between an analog input signal and a digital input signal. The phase difference between these two signals is provided as a current generated from combined chopping and gain block circuits. Current-mode operation increases the gain obtainable from prior art voltage-mode phase detectors and enables convenient filter circuit design for integration of the output signals from the phase detector. The current-mode phase detector may be used in combination with a voltage-controlled multivibrator circuit to provide a digital phase-locked loop having a high-loop gain and having improved pull-in and hold-in ranges. The combined chopping and gain block circuits enables IC implementation with a minimum number of external connections.

13 Claims, 8 Drawing Figures

INVENTOR.
James E. Thompson
BY
Mueller & Aichele
ATTY'S.

INVENTOR.
James E. Thompson
BY
Mueller & Aichele
ATTY'S.

INVENTOR.
James E. Thompson
BY
Mueller & Aichele
ATTY'S.

INVENTOR.
James E. Thompson
BY
Mueller & Aichele
ATTY'S.

INVENTOR.
James E. Thompson
BY
Mueller & Aichele
ATTY'S.

PHASE DETECTOR AND DIGITAL PHASE-LOCKED LOOP

BACKGROUND

This invention relates to both a phase detector and the use of this phase detector in a phase-locked loop.

Prior art phase detectors inherently suffer from several problems when attempts are made to fabricate them in integrated circuit form. These problems include low gain, numerous external components, and connections thereto, and inconvenient loop filter design.

Many of these problems stem from attempts to provide a linear output in voltage-mode phase detectors. These voltage-mode circuits incorporate a great many elements to preserve the linearity of a four-quadrant multiplication, and many of these elements are external to the basic circuit. Each of these external circuit elements require either an input or an output connection to the phase detector. When it became necessary to implement discrete phase detectors in integrated circuit form, it became necessary to reduce the total number of external connections to the integrated circuit in order that the phase detector as well as other circuits could be manufactured on the same semiconductor chip.

In addition, it became necessary to design a phase detector compatible with a simple filter circuit whose circuit variables could be easily changed to fit various circuit configurations. Such a circuit is one in which the phase detector filter circuit combination has a pole located at the origin of a frequency domain graph. This configuration offers tremendous convenience in establishing overall loop stability. It was therefore desirable to design a phase detector which would permit the design of a filter whose pole was located at the origin of this graph. In a voltage-mode circuit the filter pole cannot be located at the origin unless an additional stage of amplification is used. This results in additional external connections to the I/C circuit because of offsets associated with this stage of amplification.

One of the largest problems with prior art phase detectors is gain. When phase detectors are operated in a voltage-mode the devices are limited in gain by the power supply voltage. In digital integrated circuits power supply voltages rarely exceed 5 volts. It is well known that bipolar circuits with resistive loads are limited to a per stage gain of approximately $40\times V$, where $V$ is the DC voltage established across the load resistance. For digital circuit types, the absolution maximum obtainable gain would be $40\times5=200$. A more realistic value in a typical circuit would be approximately 50. However, circuits utilizing active loads such as current sources have gains determined only by incremental impedance and not by voltage drop. While level shifting circuits have been devised to overcome gain problems in voltage-mode devices their success has been limited and additional elements are needed to compensate for nonlinearities introduced.

A high-gain phase detector which is easily fabricated in integrated circuit form with a minimum of external connections is provided herein. The phase detector operates on analog and digital input signals and produces a current which is proportional to the phase difference between the two input signals. The phase difference measured by the subject circuit is with respect to phase quadrature. Thus when the two signals are said to be phase locked in the context of this invention it means that the two signals are exactly 90° out of phase.

The subject phase detector circuit involves the combination of and cooperation between two main functional blocks. The first of these functional blocks is a "chopping circuit" which functions as a multiplier to multiply the digital and analog input signals. It is important to understand that this is not a linear multiplier in which circuit nonlinearities severely affect the operation of the circuit. In prior art systems much time has been spent developing compensating circuits to make the multiplication linear. The subject system, by utilizing a chopping circuit, eliminates problem of nonlinearity and in so doing reduces the number of necessary components. As a multiplier, this chopping circuit functions as a double-pole double-throw switch. In one position this switch connects two current sources to two respective legs of the circuit such that one leg is supplied with one current and the other leg with the other current. In an opposite position the currents generated at the current sources are supplied to opposite legs. Thus the switch performs a reversing function in which the currents in the legs are exchanged or "reversed." The currents are reversed in response to changes in the amplitude of the digital input signal to the multiplier. The multiplier circuit thus operates as a chopping circuit and is referred to herein as a "±1 multiplier" to indicate multiplication in a nonlinear region.

The currents in the above-mentioned legs are subtracted one from the other in the second major component in the phase detector. This component is called a "gain block" which is specially designed to subtract the current in one leg from that in the other to produce current proportional to the above-mentioned phase difference.

One way of analyzing the phase-detecting circuit described herein is to consider the phase detector as being a multiplier whose output contains a DC term. This term corresponds to the phase difference between the two signals that are multiplied. This analysis not only applies to the case where the two input signals are analog sinusoidal wave trains but also applies to the case where one signal is a sinusoidal wave train and the other signal is a square wave train. It will be appreciated that the multiplication of a sine wave and square wave signal to generate a DC term corresponding to the phase difference between the signals corresponds to chopping of the analog signal by the digital signal. In one embodiment of the subject phase detector, two currents are provided. The first current is constant and the second current has a constant component with an analog component superimposed thereon which corresponds to the analog input signal. These currents are provided by two current sources to a first and second leg of the circuit, respectively. The chopping is accomplished by providing that the first current source provide current to the second leg and the second current source provide current to the first leg on alternate chopping cycles. If the current in one leg is subtracted from the current in the other leg, the current difference reflects the phase difference between the signal controlling the chopping and the analog signal. If the above-mentioned currents are reversed at exactly the time that the analog input signal reaches its maximum, the current difference will be at a minimum.

Alternately both currents generated by the two current sources may be altered by driving the current sources in push-pull with respect to the analog input signal. In this case the output current, which is the difference between the two currents is again proportional to the phase difference between the chopping signal and the analog signal. If these two currents are reversed when the analog signal reaches its maximum, the current difference will be at a minimum.

In one special case this minimum will equal zero. Under the conditions of ideal analysis this would mean the output voltage would be zero since zero current through any impedance yields zero volts. This is an undesirable condition since with typical voltage-controlled oscillators the oscillator would be forced to one edge of its operating range. In the subject invention the gain block is designed such that at the condition of zero phase error and zero output current an output voltage is established such that the voltage-controlled oscillator is maintained at the center of its operating range. The usefulness of this feature of the subject invention will be apparent by considering phase-locked loops used as selective filters with specified center frequencies.

Another feature is one which enables the reduction of external connections to the subject phase detector. This involves the use of a part of the analog input circuit to the phase detector as a portion of the loop filter network. A resistance element in the input circuit of the phase detector functions as a portion of the filter which integrates the output of the phase detector while simultaneously utilizing the same connection as would normally be required to admit the input signal to the IC circuit. The phase detector circuit itself is neutral in that its circuitry elements, with the exception of the input resistor, do not enter into filter design. This enables the design of a filter which insures that the aforementioned pole is located at the origin of a frequency domain graph without the necessity of considering the elements in the phase detector.

Since the subject phase detector operates in a current mode, the gain of the device is not limited by the low voltages associated with integrated circuits. The aforementioned gain block provides the subject phase detector with an arbitrarily high gain. This high gain permits complete specification of the characteristics of any loop filter to be used with this phase detector. In addition, feedback theory provides that the error in any feedback loop is a function of the loop gain once the loop is stabilized. It will be appreciated that the higher the loop gain, the smaller the phase error.

One of the major applications of the subject phase detector is its use in a phase-locked loop. Since it is a trivial problem to convert the current output of the detector to a voltage by passing the current through a load impedance, the phase detector may be used to control a voltage-controlled multivibrator. Since the subject phase detector requires digital input, the output of the voltage-controlled multivibrator can be directly coupled to the digital input to the phase detector. Thus the phase-locked loop provides a square wave pulse train from the multivibrator locked to an incoming analog wave train.

Because the subject phase detector detects the condition when the input signals are exactly 90° out of phase, the use of this device in a phase-locked loop may be characterized additionally as a 90° phase shifter and this characterization is considered part of the subject invention. Additionally, the subject phase detector can be arranged to generate a nonzero voltage (at zero current) at phase lock such that the voltage-controlled multivibrator is tuned to the center of its operating range. This also eliminates the necessity of separately biasing the voltage-controlled multivibrator to a center frequency when there is no input signal applied thereto. Further because of the high gain of the subject phase detector, its use in a phase-locked loop provides highly predictable pull-in and hold-in characteristics.

SUMMARY OF THE INVENTION

It is therefore an object of this invention to provide an improved phase detector which incorporates the combination of a chopping circuit and a gain block to provide a current which is proportional to the phase difference between analog and digital input signals.

It is another object of this invention to provide an improved phase detector having an analog and a digital input, improved gain, and a decrease in the number of external circuit terminals necessary.

It is another object of this invention to provide a phase detector which operates from an analog and a digital input and which utilizes the input impedance of the analog input circuit as part of the filter which integrates the output of the detector.

It is another object of this invention to provide a phase detector which operates in a nonlinear region from an analog and a digital input signal in which the signals are multiplied so as to provide a current whose amplitude is proportional to the phase difference between the signals.

It is a further object of this invention to provide an improved phase detector in combination with a voltage-controlled oscillator such that an improved phase-locked loop is formed.

It is another object of this invention to provide a digital phase-locked loop.

It is a still further object of this invention to provide a phase-locked loop with improved pull-in and hold-in characteristics and which utilizes an improved phase detector operating in a current mode to increase the overall gain of the system.

It is yet another object of this invention to provide, an improved system which generates a square wave phase-locked replica of a sine wave input signal.

It is another object of this invention to provide a hybrid 90° phase shifter.

It is another object of this invention to provide a phase detector whose circuit elements, with the exception of the input resistor, do not affect loop filter characteristics.

These and other objects and features of this invention will become more fully apparent from the following description of the accompanying drawings.

BRIEF DESCRIPTION OF THE INVENTION

Figure 2:
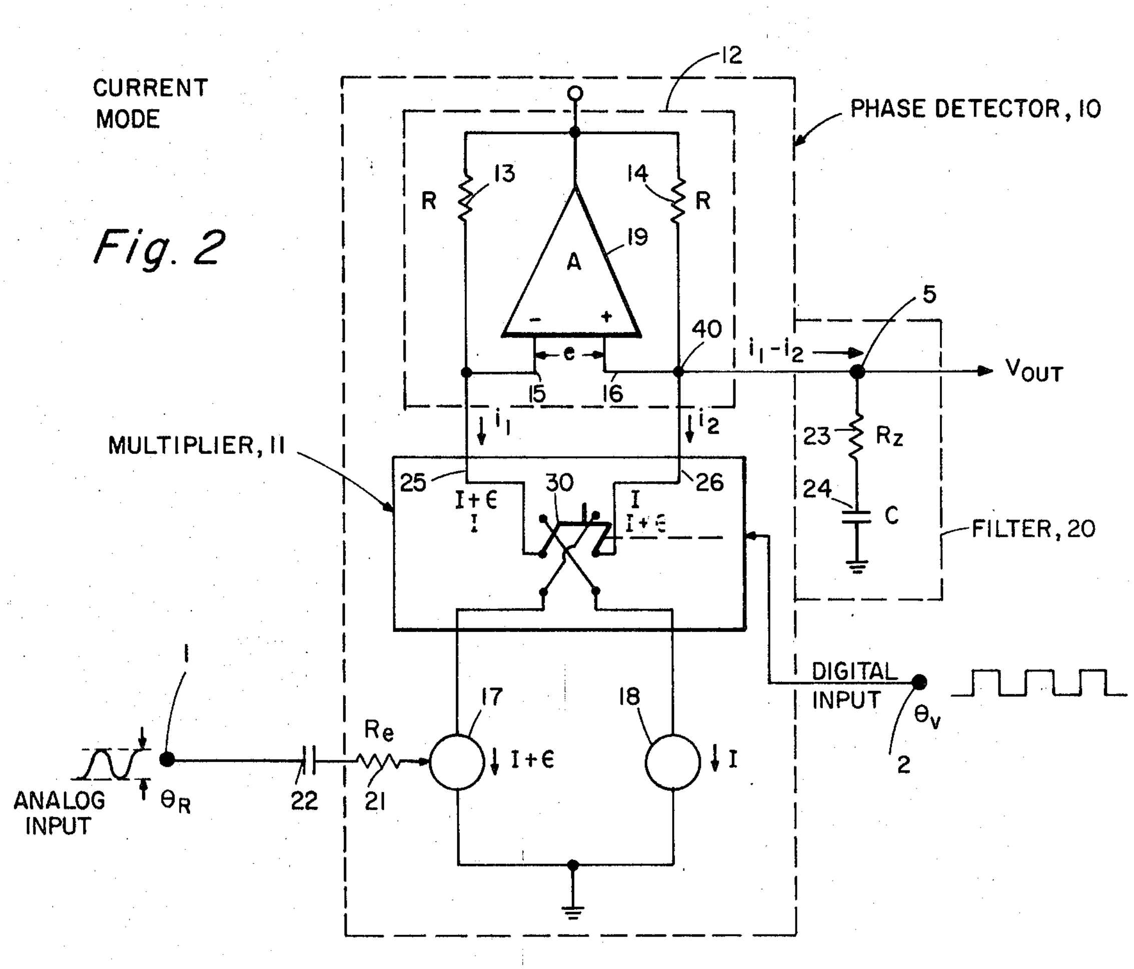
FIG. 2 is a block diagram of the phase detector which is the subject of this invention including a diagrammatic showing of a chopping circuit and corresponding current gain block which permits the subject circuit to operate in a current mode.

A phase detector is disclosed which establishes the phase difference between an analog sinusoidal input signal and a digital square wave signal input by utilizing a chopping circuit in combination with a current gain block comprising a high-gain amplifier and peripheral resistive elements. The phase difference between the analog and digital signals is in the form of a current which, when filtered through a simple RC network, provides an output voltage which may be utilized to control the frequency of a voltage-controlled multivibrator. When the voltage-controlled multivibrator output is connected to the digital input of the phase detector, a digital phase-locked loop is provided. The phase-locked loop provides that the digital output of the voltage-controlled multivibrator be phase locked to a sinusoidal input signal. While the primary application for the subject circuit is conversion of the output signal from an IF strip to digital form in a digital FM detection system, it will be appreciated that the subject phase detector and phase-locked loop may be utilized in coherent automatic gain control circuits, squelch circuits, tactical air control and navigation circuits and VHF omnidirectional ranging circuits. The subject phase-locked loop may also be used in digital frequency conversion circuits or indeed in any type of circuit in which a sinusoidal input signal is to be converted to a square wave signal with phase coincidence maintained.

DETAILED DESCRIPTION OF THE INVENTION

As mentioned hereinbefore conventional multipliers perform a phase-detecting function. If we consider $e_1=E_1\sin\omega t$ to be one of the input signals and $e_2=E_2\cos(\omega t+\theta)$ the second input signal where $\theta$ equals the phase difference between the two signals, then an ideal multiplier has a voltage output in which $$e_{out}=e_1\cdot e_2=E_1E_2\sin\omega t\cdot\cos(\omega t+\theta).$$

By use of the multiple angle formulas $$e_{out}=\{E_1E_2\tfrac{1}{2}\sin2\omega t\cos\theta-\tfrac{1}{2}\sin\theta+\tfrac{1}{2}\cos2\omega t\sin\theta\}.$$

In this equation the $-\frac{1}{2}\sin\theta$ is a DC term. The other AC components may be filtered out by a suitable filtering or integrating such that $$e_{\text{out DC}}=\frac{E_1E_2}{2}\sin\theta.$$

Since $\sin\theta$ is approximately equal to $\theta$ for small values of phase difference, then $$e_{\text{out DC}}=\frac{E_1E_2}{2}\theta.$$

As mentioned hereinbefore a multiplier having a sine wave and a square wave input will also have a DC term in its output which will correspond to the phase difference between the two signals. At this point it is only necessary to point out that multiplying a sinusoidal input signal $e_1=E_1\sin\omega t$ by a square wave signal $e_2=\pm1(\omega t+\theta)$ and detecting current changes in the output of the detector results in a much simpler multiplication and eliminates a number of terms from the output voltage of this phase detector such that a simplified expression can be derived for the design of a suitable filter network which will integrate the output of the phase detector. The output of the filter will produce a signal proportional to the phase difference between the sinusoidal input signal and the square wave input signal.

The previous short analysis has been concerned primarily with the phase difference between two voltages. The difference between the subject phase detector and the prior art phase detectors is that the input voltages are changed into corresponding currents.

Figure 1:
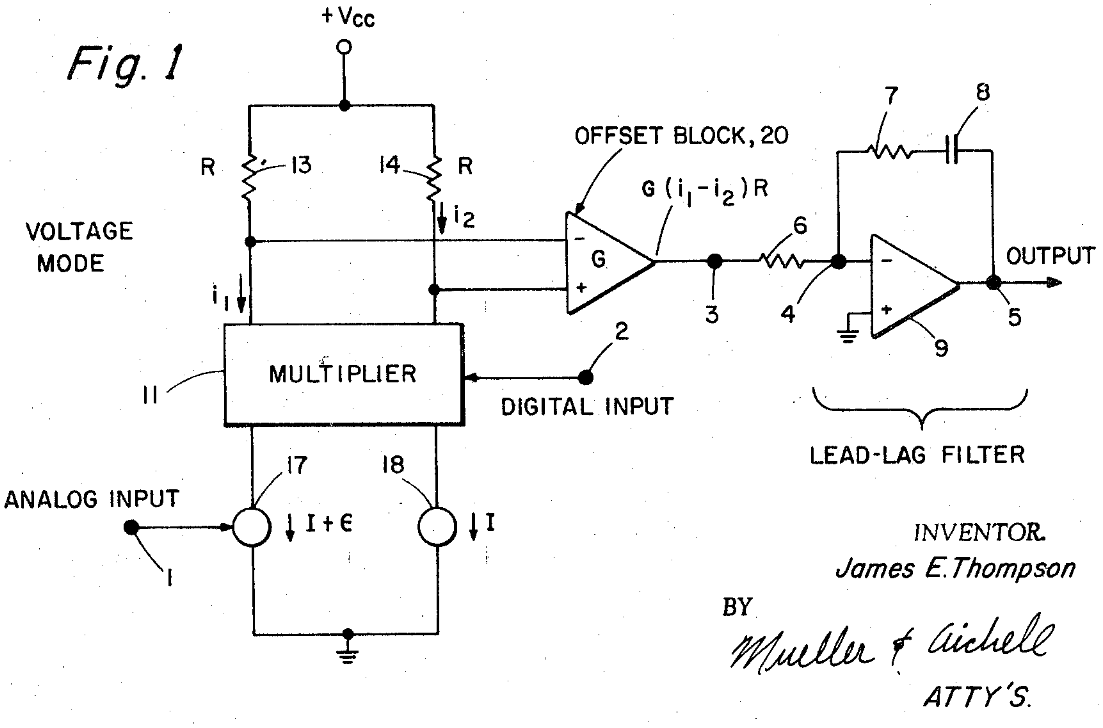
FIG. 1 is a block diagram of a voltage-mode version of the subject phase detector showing the number of external connections necessary to provide for proper functioning of the voltage-mode version.

More specifically, referring to FIG. 1, assuming an analog input voltage at terminal 1 of the device, it can be seen that this voltage is applied to a current source 17. Fluctuations in the input voltage are transformed by the current source into fluctuations of the current generated by the current source. The current normally generated by current source 17 is indicated by the letter I and that additional current which is generated in response to the analog input voltage is indicated by the character $\epsilon$. At this point it is appropriate to note that there is another current source which generates a constant current I. This is shown at 18.

The digital input is also a voltage and is applied at terminal 2. This digital input is also converted into a current. However, this conversion is not done directly. It is accomplished rather by reversing the currents in each of two balanced legs with resistors 13 and 14 therein. Reversing refers to providing that one leg be supplied first with a current equal to $I+\epsilon$ and then with a current equal to $I$. The other leg starts out with a current equal to $I$ and then changes to a current equal to $I+\epsilon$. The digital input voltage controls the reversing cycle. Current reversing is equivalent to changing the digital input voltage into a corresponding current and it is the analog current and the digital current which are effectively multiplied.

The current reversing takes place at multiplier 11 which is basically a double-pole double-throw switch. The outputs of the multiplier are shown to be through resistors 13 and 14 and are shown by currents $i_1$ and $i_2$, respectively. It will be appreciated that current source 17 converts the analog input voltage to an analog input current and that multiplier 11 converts the digital input voltage to a digital input current by reversing the currents available from current sources 17 and 18 through the output legs.

The phase detector shown in FIG. 1, however, operates to a certain extent in the voltage mode. The reason for this is that the output is in voltage form. It will be appreciated that the output voltage in one leg is equal to $i_1R$ and that the voltage in the other leg is equal to $i_2R$. If these output voltages are applied to an operational amplifier such as that shown by offset block 20, it will be appreciated that these voltages can be subtracted one from another and that the output voltage $G(i_1-i_2)R$ is a function of the phase difference between the analog and digital input signals. Offset block 20 is utilized not only to subtract one of the output voltages from the other but is also used to amplify the output voltage of the detector by that amount which is necessary to compensate the output at output terminal 5. The basic integration circuit which will provide a pole-zero at the origin of a frequency domain graph for the voltage-mode phase detector is shown by the resistive elements 6 and 7 and capacitor 8. Since elements 6, 7 and 8 are user-variable, external circuit terminals 3 and 4 are necessary so that element 6 can be coupled to the phase detector circuit and so that integrated circuit composed of amplifier 9 and resistive element 7 and capacitive element 8 can be connected. While the configuration shown in FIG. 1 does in fact convert the analog and digital input voltages to currents, the output of the device is a voltage which is proportional to the phase difference between the analog and digital input signals. Because of this voltage-mode operation, two additional terminals and an additional amplifying stage are necessary. Moreover, gain must be provided since not much can be obtained directly from the phase detector in loads $R_{13}$ and $R_{14}$.

If, however, a total current-mode operation is achieved by the addition of gain block 12 in FIG. 2 which functions as a current load, the gain is determined by the gain factor of the gain block and ultimately by the current-carrying capacity of the semiconductor elements in the integrated circuit. In addition to increasing the gain over the voltage-mode case, the phase detector as shown in FIG. 2, utilizes only three external connection terminals and only one amplification section. These are labeled 1, 2, 5 and 19 respectively. In addition, there is an input resistor $R_e$ at 21 which can be easily included in the integrated circuit. This resistor forms a part of filter network 20 and enables a filter transfer characteristic which places the pole at the aforementioned origin of a frequency domain graph.

As explained earlier, since the subject circuit can be made to have a predetermined output voltage through an output load when phase coincidence occurs, it is possible to design this circuit such that a voltage-controlled oscillator may be supplied with a control voltage even though there is phase coincidence between the two input signals at the phase detector. This prevents the voltage-controlled multivibrator from going off range and maintains its output frequency at a preset level.

OPERATION OF THE PHASE DETECTOR

The operation of the detector shown in FIG. 2 will now be described. In this figure phase detector 10 is provided with a $\pm1$ multiplier circuit 11 and a gain block or current source load 12 which includes an amplifier 19 and resistors 13 and 14. These resistors are coupled between the output of the amplifying circuit and the inverting and noninverting inputs to the amplifier labeled 15 and 16 respectively. The phase detector also includes current sources 17 and 18 which when they are both generating equal currents result in a balanced condition in which the output of the phase detector results in a 0 current.

If the digital input signal is applied to the $\pm1$ multiplier 11 and the currents through current sources 17 and 18 are equal then the output of the phase detector 10 to filter 20 will be equal to 0. If, however, the phase of the current generated by current source 17 is altered by an analog input signal $V_p\sin\omega t$ then the DC term of the output current will only be 0 if the analog and digital input signals are exactly 90° out of phase. The input signal $V_p\sin\omega t$ is coupled through capacitor 22 and resistor 21 into current source 17 thereby altering the current generated by current source 17 by an additional amount $\epsilon$. Further assuming that the analog input signal is sinusoidal and has a peak voltage $V_p$ then the output voltage of the filter 20 will be shown to be $$V_{\text{out}}=\frac{V_p}{\pi Re}(\theta_R-\theta_V)\frac{R_zCs+1}{Cs}$$

where $R_z$ and $C$ refer to elements 23 and 24 of filter 20, $s$ is the LaPlace variable, and where $\theta_R$ and $\theta_V$ are the phase of the sine and square waves which serve as the two input signals.

It will be shown that $V_{out}$, the output of filter 20, is equal to 0 when the phase difference between $\theta_R$ and $\theta_V$ is exactly equal to 90°. Assuming initially that current source 18 is generating a current $I$ and current source 17 is generating a current $I+\epsilon$ corresponding at a particular time to the value of the analog input signal, then multiplier 11, shown in its most simple configuration as a double-pole double-throw switching device, passes current $I+\epsilon$ in the left-hand leg shown at correspondingly and correspondingly the current $I$, in the right-hand leg 26 when the knife blades of the double-pull double-throw switch 30 are thrown downwardly. This position corresponds, for example, to a low value of the digital input signal. With a change of the digital input signal to a high value, switch 30 is thrown such that the knife blades are in the upward position. This reverses the current source connections through legs 25 and 26 resulting in the current $I$ flowing through leg 25 and a current $I+\epsilon$ flowing through leg 26.

Figure 5:
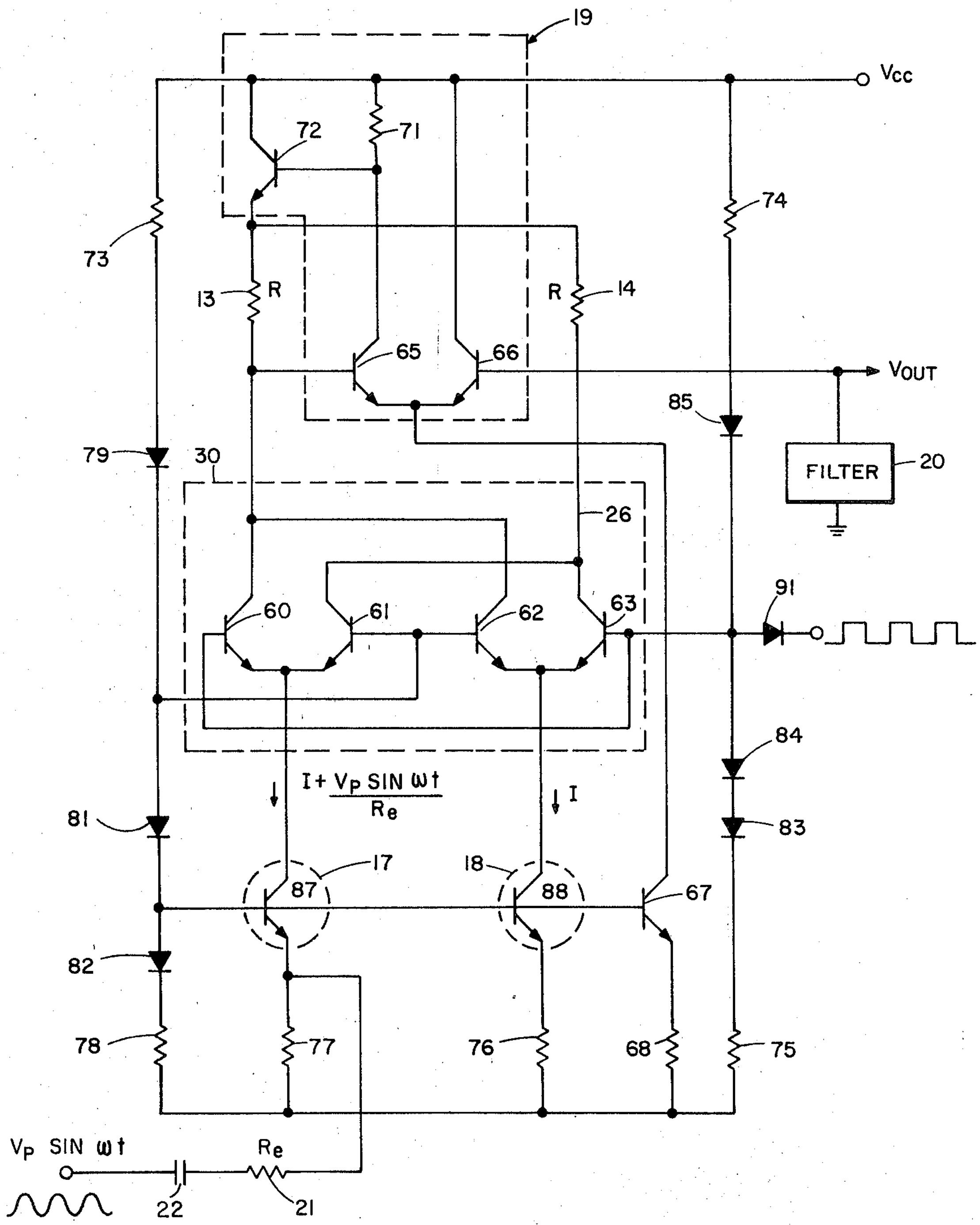
FIG. 5 is a complete schematic diagram of one embodiment of the phase detector shown in FIG. 2.
Figure 6:
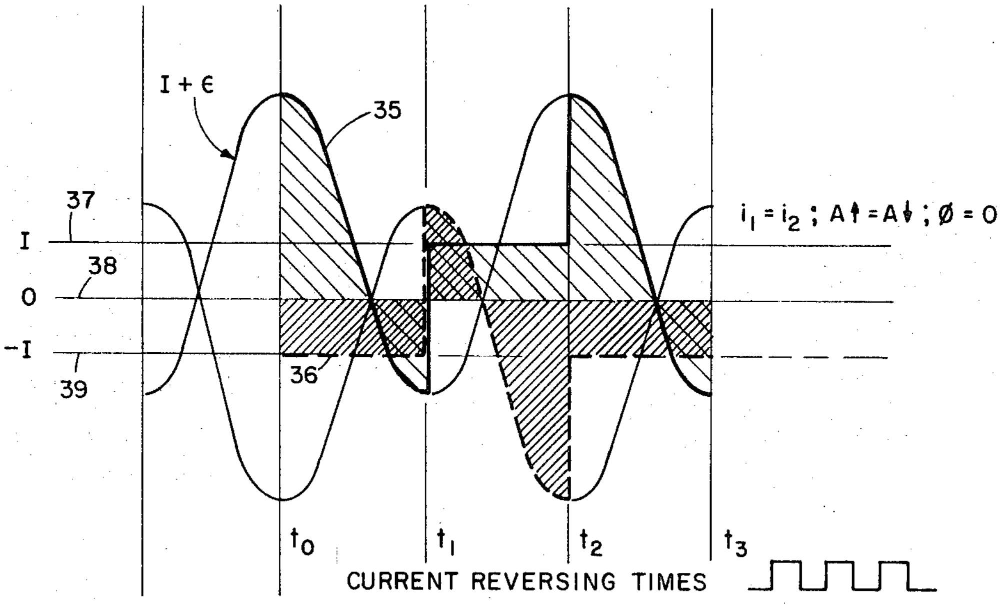
FIGS. 6 and 7 are graphs showing the currents available at the output of the chopping circuit shown in FIGS. 2 and 4, in which the current-reversing times as dictated by the digital input signal are shifted by a phase angle $\phi$.
Figure 7:
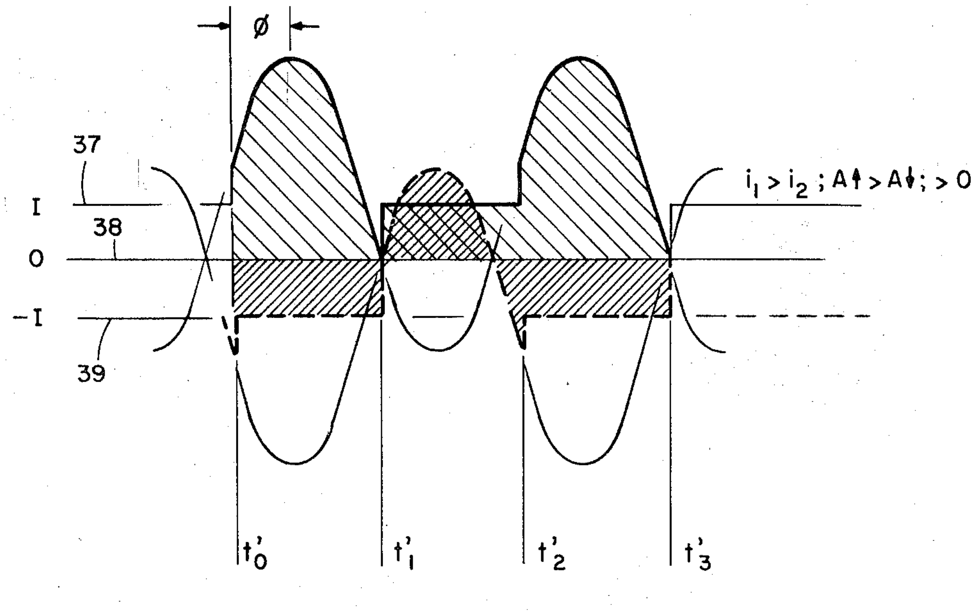

Referring now to FIGS. 6 and 7 it will be appreciated that if $i_1$ is the current flowing through leg 25 and $i_2$ is the current flowing through leg 26 then $i_1-i_2$ will be proportional to the phase difference between the analog input signal and digital input signal. If the analog and digital input signals are of the same frequency then if the analog input signal is 90° out of phase with respect to the digital input signal, legs 26 and 26 will be carrying the current shown by solid line 35 and dotted line 36 respectively. In this graph, solid line 35 represents a current value equal to $I+\epsilon$. The constant current value $I$ is denoted by line 37. Zero current is denoted by line 38 and a $-I$ current is shown by line 39. The current in legs 25 and 26 are graphed in such a manner that they may be subtracted by inspection of the graph. It will be appreciated that at the time $T_0$, which is governed, for instance, by the onset of a low value of the square wave signal delivered to multiplier 11 in FIG. 2, the current flowing through leg 25 will be equal to constant value $I$ plus an AC component $\epsilon$ for the time period between $T_0$ and $T_1$. The current, however, in leg 26 at this time will be a constant $I$. At time $T_1$, however, the current flow situation is reversed and leg 25 is then carrying a constant current equal to $I$ and leg 26 is carrying a current equal to this constant current $+\epsilon$. If $i_2$ is subtracted from $i_1$ and the resulting current integrated over time then it can be seen from FIG. 5 that the net current will be equal to 0. This can best be seen by considering the areas under the respective curves noting the symmetry above and below line 38.

If, however, there is some phase difference other than 90° between the analog and digital signal, as shown in FIG. 7 by the character $\phi$, then the areas under the curves above line 38 and below line 38 are not equal such that if $i_2$ is subtracted from $i_1$, the result is nonzero indicating the analog and digital input signals are out of phase by some phase angle other than 90°. From inspection of this graph it will be appreciated that the area under the respective curves when integrated over time results in a value greater than 0. This value is proportional to the phase angle $\phi$ as described hereinbefore. Thus it can be seen in FIG. 2 that if the double-pole double-throw switch is controlled by the digital input signal, and if $i_2$ can be subtracted from $i_1$ in a convenient manner, the current difference will be directly proportional to the phase lag between the digital and analog input signals or more accurately the phase difference.

The subtraction of $i_2$ from current $i_1$ is accomplished by current source load or gain block 12 of FIG. 2. The current source load shown at 12 in FIG. 2 accomplishes this current subtraction purely in terms of current. Unlike the system shown in FIG. 1 which first converts $i_1$ and $i_2$ into voltages and then derives a voltage difference, the system shown in FIG. 2 derives a current difference directly. Assuming that amplifier 19 has a gain approaching infinity and further that the inputs to amplifier 19 draw no current, then the voltage differential, $e$, between these inputs approaches 0. If $e$ approaches 0 then it follows that there is an equal voltage drop, $V_x$, across resistors 13 and 14. If this occurs $i_{13}=i_{14}$ since the current $i=V_x/R$ for both legs. If $i_{13}=i_{14}$ then for a given state of multiplier 11, $i_{13}=i_1=I+\epsilon$. Since $i_{13}=i_{14}$, $i_{14}=I7g$. However, current source 18 is generating $I$ and drawing this current through resistor 14. From the above analysis resistor 14 is already drawing $i_{14}$, which in this case is $I+\epsilon$. Thus there is an overage of current $(I+\epsilon)-I=\epsilon$, being "generated" over that generated by current source 18. This "overage" is drawn by a load impedance at the output. Thus $\epsilon=i_1-i_2$ is available at output 5.

The generation of $i_1-i_2$ was predicted on the assumption that the gain of amplifier 19 was large such that $e$, the voltage differential at the input terminals to this amplifier, would approach 0. Since amplifiers may be provided with many amplification stages, obtaining an appropriately high gain is a relatively simple matter. However, in one experimental configuration a gain of only 10 produced acceptable results.

Thus if the gain of the amplifier is sufficiently large the absolute value of the current at point 40 will be $$|i_1-i_2|=|I-(I+\epsilon)|.$$

This current differential is the output of phase detector 10 and is coupled to filter 20 which is composed simply of a resistor 23 and the aforementioned capacitor 24. The value of resistors is labeled $R_z$ and the capacitance of capacitor 24 is $C$. It can be shown that if the input signal is $V_p \sin\omega t$ and if the input resistor 21 has a resistance $R_e$, then the output of filter 20 will be $(V_p/\pi R_e)(\theta_R-\theta_V)(R_z Cs+1)/Cs$.

Figure 3:
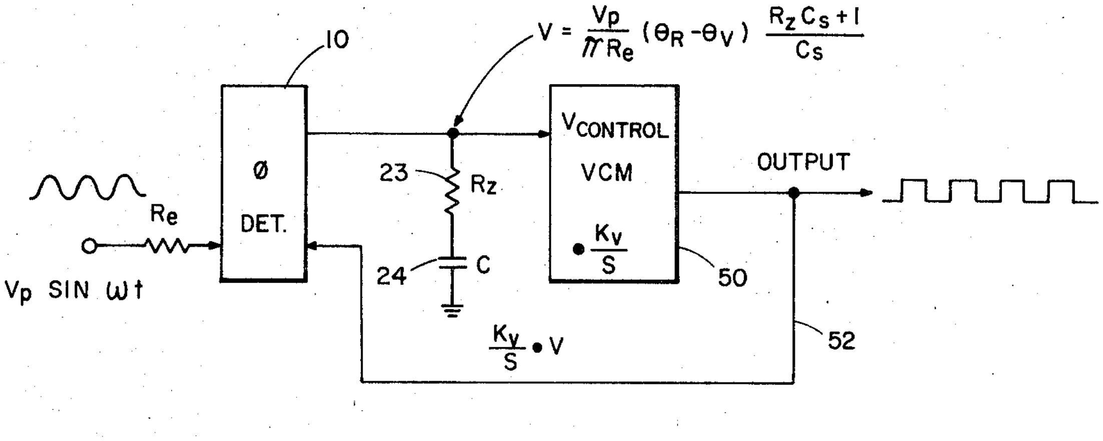
FIG. 3 is a block diagram of a phase-locked loop utilizing the subject phase detector.

It can be shown that the filter transfer function of filter 20 is $(R_z Cs+1)/R_e Cs$ for an ideal pole-zero lead-lag network when the phase detector is used in the phase-locked loop of FIG. 3. In this case the output of the filter is used to control a voltage-controlled multivibrator shown at 50 whose output 51 is a square wave having a frequency proportional to $V_{control}$. $V_{control}$ is coupled to the output of filter 20. A feedback circuit 52 is shown tapped from output 51 and returns to one of the inputs of phase detector 10. In general, $i_1-i_2$ is equal to $V_p \sin\theta/\pi R_e$ where $V_p$ is the peak value of the analog input and $\theta$ is the instantaneous quadrature phase difference between $V_p\sin(\omega t+\theta_R)$ and $\pm1(\omega t+\theta_v)$. As before, $R_e$ is the input resistor. The voltage-controlled multivibrator has a transfer characteristic $K_{v/s}$ where $K_v$ is the change in frequency of the voltage-controlled multivibrator per unit change of the control voltage. Since phase is the integral of frequency and phase is the variable, the transfer function of the voltage-controlled multivibrator equals $K_{v/s}$ (in Laplace notation). Therefore the output phase of the voltage-controlled multivibrator 50 is $\theta_v=(K_v/S)\cdot V$ where $V$ is the control voltage to the multivibrator. Thus, $$\theta_V=\frac{Kv}{s}\cdot\frac{V_p}{\pi R_e}(\theta_R-\theta_V)\frac{R_z Cs+1}{Cs}.$$

Rearranging the terms of this equation the closed loop equation reduces to $$\frac{\theta_v}{\theta_r}=\frac{K_v V_p}{\pi R_e}\cdot\frac{R_z Cs+1}{s^2+\frac{K_v V_p R_z}{\pi R_e}s+\frac{K_v V_p}{\pi R_e C}}.$$

It will be appreciated that the denominator of this equation is a single quadratic in which the middle term is $2\xi\omega_n$ where $\xi$ is the damping factor. The constant end term is $\omega_n{}^2$ where $\omega_n$ is the loop bandwidth. By choosing appropriate values for $R_3$, $C$ and $R_z$, $\xi$ and $\omega_n$ may be varied. Pull-in range, $\Delta\omega_p$, and hold-in range, $\Delta\omega_H$, can be chosen since they are functions of $\xi$, $\omega_n$ and $V_p$, It will be appreciated that the major reason for the current output of the phase detection portion of this circuit is to make the filter easy to design because a filter having a filter function $(R_z Cs+1/Cs)$ may be utilized. This in turn gives the final closed loop equation a single quadratic loop characteristic which is easy to optimize.

Figure 4:
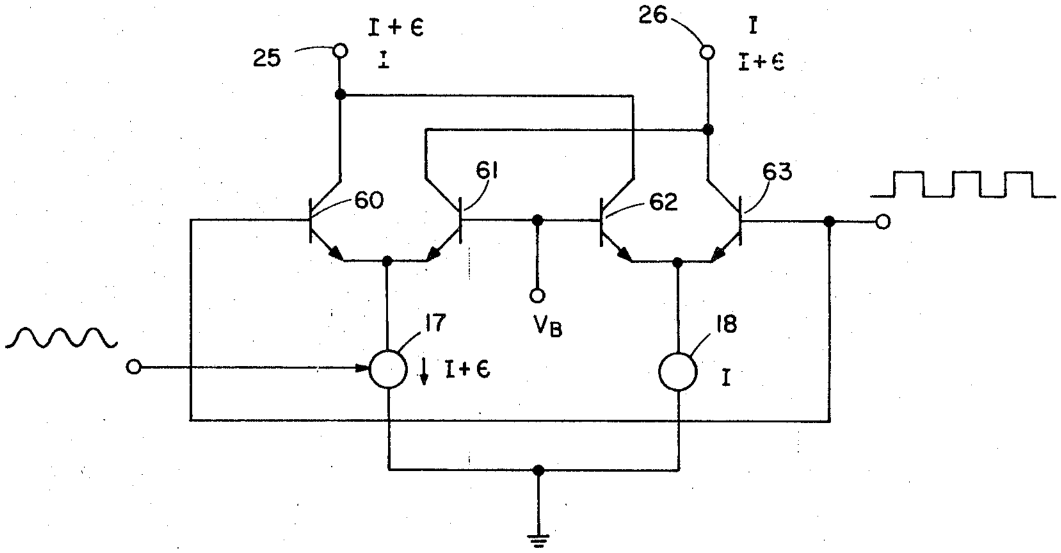
FIG. 4 is a partial schematic diagram of the chopping circuit shown in FIG. 2.

Turning now to FIG. 4 there is shown a schematic diagram of a circuit which is the equivalent of double-pole double-throw switch 30 shown in FIG. 2. In this diagram current sources 17 and 18 are the same as current sources shown in FIG. 2. As is generally accepted a double-pole double-throw switch is composed of two differential pairs of emitter-coupled NPN-transistors labeled 60, 61, 62 and 63. The bases of generated 61 and 62 are provided with a bias voltage or reference voltage as shown. The bases of transistors 60 and 63 are coupled to a clocking pulse which in this case is the digital input signal to multiplier 11. With the clock pulse low the base voltage delivered to transistor 60 and 63 is very much lower than the bias voltage applied to the bases of transistors 61 and 62. The application of this low clocking pulse renders transistors 61 and 62 conducting while turning OFF transistors 61 and 63. Current generated by current source 17 flows through transistor 61 to output leg 26 while the current generated by current source 18 flows through transistor 62 to output leg 25. The currents are reversed when the clock pulse goes high such that transistor 61 and 62 are turned OFF and transistors 60 and 63 are rendered conductive. In this case current source 17 generates a current which flows through leg 25 and current source 18 generates current which flows through output leg 26.

The complete schematic diagram for one circuit implementation of the phase detector shown in FIG. 2 is shown at FIG. 5 with double-pole double-throw switch 30 utilizing the differential pairs discussed in connection with FIG. 3. The amplifier in gain block 21 is shown in dotted box labeled 19 and current sources 17 and 18 are shown in dotted circles bearing these numbers. The amplifier itself consists of a differential pair of emitter-coupled transistors 65 and 66 coupled to a current source composed of transistor 67 and resistor 68, and is biased in such a fashion that the amplifier has an extremely high gain. It will be appreciated that transistor 65 has a collector coupled to a power source labeled $V_{cc}$ through resistor 71. This collector is also coupled to the base of transistor 72 which provides the output of the amplifier. Since higher gain amplifiers may be obtained by cascading emitter-coupled pairs, the amplifier shown in this figure is just one of many which can be used in the gain block. Resistors 73, 74, 75, 76, 77 and 78 and diodes 79, 81, 82, 83, 84 and 85 provide the necessary bias voltages for the various active elements in the circuit. It will be appreciated that the current sources include single NPN-transistors shown at 87 and 88. The currents generated by these current sources are controlled by the composition of the transistors, the base voltage applied thereto between diodes 81 and 82 and resistors 77 and 76. The current delivered by current source 17 is, however, altered by an amount $V_p \sin\omega t/R_e$ where $R_e$ is the input resistance to the emitter of transistor 21. The analog input to the phase detector is delivered between the emitter of transistor 87 and ground such that the current generated by the current source 17 is equal to $I+(V_p \sin\omega t/R_e)$. Diode 91 is in series with the digital input for the phase detector so as to simulate the input characteristics of a DTL or a TTL gate and provide proper turn-on, turnoff characteristics for the switch.

Figure 8:
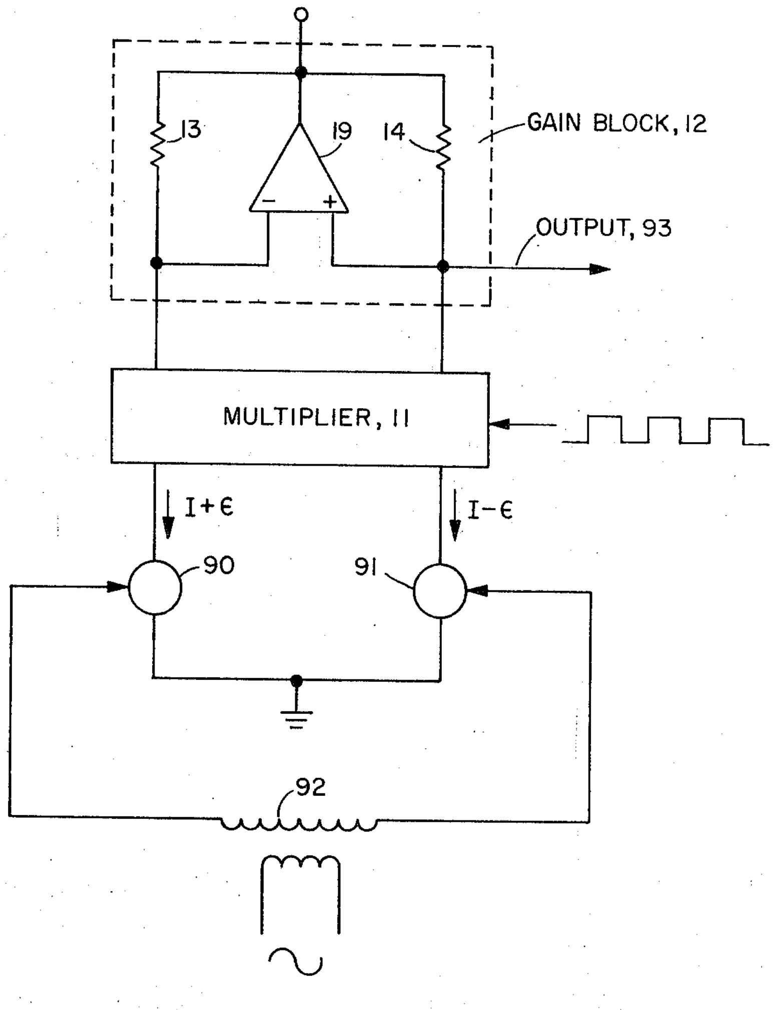
FIG. 8 is a block diagram of the subject phase detector with a push-pull current drive circuit.

Referring briefly to FIG. 8 the phase detector can be provided with a push-pull fed analog input signal. In the circuit shown in FIGS. 1, 2 and 5, one current source always provided a constant current. A balanced input device having variable current sources 90 and 91 coupled across the secondary of transformer 92 provides multiplier 11 with currents $I+\epsilon$ and $I-\epsilon$. The current difference $i_1-i_2$ appearing at output 93 is $2\epsilon$, indicating a gain of two over the circuit in FIG. 2. Thus the phase detector may be directly driven from the secondary of an IF transformer by the above push-pull arrangement.

The phase detector and the phase-locked loop thus described comprise a digital system of described less complexity than general purpose phase detectors. The utilization of this current-mode phase detector makes a filter system utilized in the phase-locked loop extremely easy to design. The detector requires fewer external contacts, improves the gain of phase-locked loops, utilizes an analog and digital input signal, may be used as a phase shifter and improves hold-in and pull-in characteristics of corresponding phase-locked loops. Most importantly, however, the subject circuit completely eliminates those additional circuit elements which were necessary to preserve linearity in prior art phase detectors.

What is claimed is:

1. Apparatus for detecting the phase difference between an analog input signal and a digital input signal comprising:
   means for generating a signal having a current which is proportional to the phase difference between said input signals, so as to provide a current-mode phase detector operating in a nonlinear region, wherein said phase difference is the relative phase of said input signals with respect to a phase difference of 90° between said input signals,
   said signal generating means including
   a source of potential voltage;
   first and second current-generating means, said second current-generating means generating a constant current in said first current-generating means generating a current having a constant component and a component whose amplitude is responsive to the voltage amplitude of said analog input signal;
   an output circuit having first and second legs, one end of said first leg being connected to one end of said second leg and to said source of potential voltage;
   means for delivering current from said first current source to said first leg and from said second current source to said second leg in response to said digital input signal being at a first predetermined value, and for delivering current from said first source to said second leg and from said second source to said first leg in response to said digital input signal being at a second predetermined level, the time-averaged difference in current in said first and second legs being proportional to the phase difference between said input signals.

2. The apparatus as recited in claim 1 wherein said output circuit includes means for subtracting the current in said first leg from that in said second leg.

3. The apparatus as recited in claim 1 wherein said output circuit includes resistive elements of equal value in each of said legs between the ends thereof.

4. The apparatus as recited in claim 1 and further including means having an inverting and a noninverting input circuit for amplifying the difference in voltage between said inverting and noninverting input circuits and for providing the amplified result at the output thereof, said output being connected to said one end of said first and second legs, said inverting input circuit being connected to the other end of said first leg and said noninverting input circuit being connected to said other end of said second leg, whereby the current in said first leg is subtracted from that in said second leg, the difference in current being available at either one of said other ends of said legs, said difference in current being proportional to said phase difference.

5. The apparatus as recited in claim 3 and further including an analog input circuit coupled to said first current source, said input circuit having a first resistive element having a resistance $R_e$ whereby the difference in current between said first and second legs is given by the expression $(V_p/\pi R_e) \sin\theta$, where $V_p$ is the peak voltage of said analog input and $\theta$ is the quadrature phase difference between said inputs.

6. The apparatus as recited in claim 5 and further including a filter circuit comprising a second resistive element having a resistance $R_z$ and a capacitive element coupled in series with said second resistive element between a reference potential and one of said other ends of said legs, said capacitive element having a capacitance $C$, the voltage between said one of said other ends and said reference potential being $(V_p/\pi R_e)\ (\theta_R-\theta_V)\ (R_zCs+1/Cs)$ where $\theta_R$ is the phase of said analog input signal, $\theta_V$ is the phase of said digital input signal and $s$ is the Laplace variable.

7. The apparatus as recited in claim 6 and further including a voltage-controlled multivibrator circuit having its voltage control input coupled to said one other end, said current delivery means being responsive to the amplitude of the digital signal available at the output of said voltage-controlled multivibrator, whereby a digital phase-locked loop is formed.

8. Apparatus for detecting the phase difference between an analog and a digital input signal comprising in combination first and second current sources for generating first and second currents in response to the amplitude of said analog input signal such that a push-pull feed is provided;

a gain block, having first and second current source load circuits, one side of each of said current source load circuits adapted to be coupled to a source of potential voltage, and gain block including means for amplifying the voltage difference between the other sides of said current source load circuits and for coupling said amplified difference to said one side of each current source load circuit, said current source load circuits having resistance between opposite sides thereof; and signal chopping means for connecting said current sources at one time each to different current source load circuit in response to the amplitude of said digital input signal being at a first predetermined value and for reversing said connection at a second time in response to said digital input signal being at a second predetermined value such that said analog and digital input signals are multiplied, whereby the difference in current flowing in said current source load circuits is proportional to the phase difference between said analog and digital input signals.

9. Apparatus for detecting the phase difference between an analog and a digital input signal comprising in combination first and second current sources for generating first and second currents, the current generated by said first current source having a constant component and a variable component having an amplitude responsive to said analog input signal, the current generated by said second current source being at a constant value;

a gain block, having first and second current source load circuits, one side of each of said current source load circuits adapted to be coupled to a source of potential voltage, said gain block including means for amplifying the voltage difference between the other sides of said current source load circuits and for coupling said amplified difference to said one side of each current source load circuit, said current source load circuits having resistance between opposite sides thereof; and signal-chopping means for connecting said current sources at one time each to a different current source load circuit in response to the amplitude of said digital input signal being at a first predetermined value and for reversing said connection at a second time in response to said digital input signal being at a second predetermined value such that said analog and digital input signals are multiplied.

10. The apparatus as recited in claim 9 wherein said current source load circuits have matching resistance elements between opposite sides thereof.

11. In combination, a phase detector which generates a current proportional to the phase difference between an analog input signal and a digital input signal;

means for integrating said current over time and for providing a voltage proportional to said integrated current; and voltage-controlled oscillator means for generating said digital signal having a frequency proportional to the amplitude of said voltage, whereby a digital phase-locked loop is formed in which said digital signal is phase locked with respect to said analog input signal whenever said current is at a minimum.

12. The combination as recited in claim 11 wherein said phase detector includes an input circuit having a resistive element, said voltage being a function of only the following variables:

the resistance of said resistive element, the resistance of the resistance element in said integrating means, the capacitance of the capacitor in said integrating means, the peak voltage of said analog signal, the Laplace variable, and the phase difference between said analog and digital input signals, whereby said input circuit resistance forms part of the filter characteristic of said integrating means and whereby the other elements in said phase detector do not affect the transfer function of said filter.

13. A hybrid phase-shifting circuit comprising in combination a phase detector which generates a current proportional to the phase difference between an analog input signal and a digital input signal, said phase detector including; first and second current sources for generating first and second currents in response to the amplitude of said analog input signal; a gain block having first and second current source load circuits, one side of each of said current source load circuits adapted to be coupled to a source of potential voltage, said gain block including means for amplifying the voltage difference between the other sides of said current source load circuits and for coupling said amplified difference to said one side of each current source load circuit, said current source load circuits having resistance between opposite sides thereof; and signal-chopping means for connecting said current sources at one time each to a different current source load circuit in response to the amplitude of said digital input signal being at a first predetermined value and for reversing said connection at a second time in response to said digital input signal being at a second predetermined value such that said analog and digital input signals are multiplied;

means for integrating the output current of said phase detector over time and for providing a voltage proportional to said integrated current; and voltage-controlled oscillator means for generating said digital signal having a frequency proportional to the amplitude of said voltage whereby a digital phase-locked loop is formed in which said digital signal is shifted exactly 90° with respect to said analog input signal whenever the current from said phase detector is at a minimum.

* * * * *